United States Patent
Konkapaka

(10) Patent No.: US 10,608,123 B2
(45) Date of Patent: Mar. 31, 2020

(54) METAL OXIDE SEMICONDUCTOR VARACTOR QUALITY FACTOR ENHANCEMENT

(71) Applicant: QUALCOMM Incorporated, San Diego, CA (US)

(72) Inventor: Phanikumar Konkapaka, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 134 days.

(21) Appl. No.: 15/709,362

(22) Filed: Sep. 19, 2017

(65) Prior Publication Data

US 2018/0323316 A1    Nov. 8, 2018

Related U.S. Application Data

(60) Provisional application No. 62/503,266, filed on May 8, 2017.

(51) Int. Cl.
| | | |
|---|---|---|
| *H01L 29/93* | (2006.01) | |
| *H03B 5/12* | (2006.01) | |
| *H01L 29/49* | (2006.01) | |
| *H01L 27/06* | (2006.01) | |
| *H04B 1/40* | (2015.01) | |

(52) U.S. Cl.
CPC .......... *H01L 29/93* (2013.01); *H01L 27/0629* (2013.01); *H01L 29/4966* (2013.01); *H03B 5/1212* (2013.01); *H03B 5/1228* (2013.01); *H03B 5/1265* (2013.01); *H03B 2200/004* (2013.01); *H03B 2200/009* (2013.01); *H04B 1/40* (2013.01)

(58) Field of Classification Search
CPC .. H01L 29/93; H01L 27/0629; H01L 29/4966
See application file for complete search history.

(56) References Cited

U.S. PATENT DOCUMENTS

| | | | |
|---|---|---|---|
| 6,100,770 A | 8/2000 | Litwin et al. | |
| 7,038,527 B2* | 5/2006 | Titus | H01L 27/0808 257/E27.049 |
| 8,574,984 B2 | 11/2013 | Anezaki | |
| 9,520,392 B1 | 12/2016 | Cheng et al. | |

(Continued)

OTHER PUBLICATIONS

International Search Report and Written Opinion—PCT/US2018/026571—ISA/EPO—Jul. 3, 2018.

(Continued)

*Primary Examiner* — Errol V Fernandes
(74) *Attorney, Agent, or Firm* — Qualcomm Incorporation/Seyfarth Shaw LLP

(57) ABSTRACT

An integrated circuit formed with a process that enables multiple types of gate stacks improves a quality factor of metal oxide semiconductor (MOS) varactors at the device level. In one instance, the integrated circuit includes multiple first type transistors having a first gate stack with a first resistance and multiple second type transistors having a second gate stack with a second resistance that is higher than the first resistance. The integrated circuit also includes a metal oxide semiconductor varactor having the first gate stack with the first resistance.

18 Claims, 9 Drawing Sheets

(56) References Cited

U.S. PATENT DOCUMENTS

| | | | |
|---|---|---|---|
| 2004/0184216 A1* | 9/2004 | Kurosawa | H01L 27/0808 |
| | | | 361/277 |
| 2004/0203213 A1 | 10/2004 | Chung | |
| 2006/0238265 A1* | 10/2006 | Soltanian | H03L 7/099 |
| | | | 331/167 |
| 2008/0315277 A1* | 12/2008 | Nakashiba | H01L 27/0629 |
| | | | 257/312 |
| 2009/0057746 A1 | 3/2009 | Sugll et al. | |
| 2009/0243743 A1* | 10/2009 | Kossel | H03B 5/1228 |
| | | | 331/179 |
| 2016/0379993 A1 | 12/2016 | Faul | |

OTHER PUBLICATIONS

Maget J., et al., "MOS Varactors with N-and P-Type Gates and their Influence on an LC-VCO in Digital CMOS", IEEE Journal of Solid-State Circuits, IEEE Service Center, Piscataway, NJ, USA, Jul. 1, 2003, vol. 38, No. 7, XP001169597, ISSN: 0018-9200, DOI: 10.1109/JSSC.2003.813288, pp. 1139-1147.

* cited by examiner

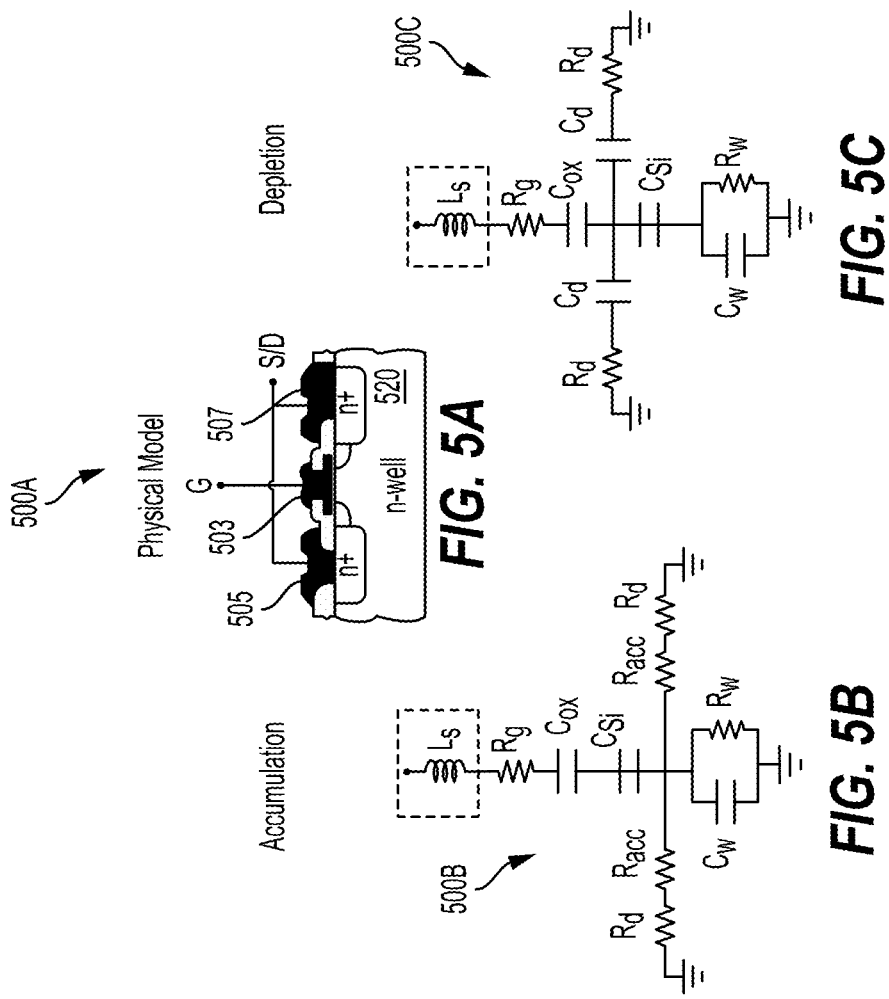

METAL OXIDE SEMICONDUCTOR VARACTOR QUALITY FACTOR ENHANCEMENT

CROSS-REFERENCE TO RELATED APPLICATION

The present application claims the benefit of U.S. Provisional Patent Application No. 62/503,266, filed on May 8, 2017, and titled "METAL OXIDE SEMICONDUCTOR VARACTOR QUALITY FACTOR ENHANCEMENT," the disclosure of which is expressly incorporated by reference herein in its entirety.

TECHNICAL FIELD

The present disclosure generally relates to metal oxide semiconductor varactors. More specifically, the present disclosure relates to improving a quality factor of the metal oxide semiconductor varactors.

BACKGROUND

Mobile radio frequency (RF) chip designs (e.g., mobile RF transceivers) have migrated to a deep sub-micron process node due to cost and power consumption considerations. The design complexity of mobile RF transceivers is further complicated by added circuit function to support communication enhancements. Further design challenges for mobile RF transceivers include analog/RF performance considerations, including mismatch, noise, and other performance considerations. The design of these mobile RF transceivers includes the use of a voltage controlled capacitance and/or a tunable capacitor (e.g., a varactor), for example, to provide a voltage controlled oscillator.

Digitally controlled or voltage controlled oscillators may have very sensitive nodes where thermal noise may be converted to phase noise around an oscillation frequency. Biasing these nodes may negatively affect the oscillator by lowering the quality (Q)-factor of the tank circuit, thus increasing its phase noise. Some systems can implement resistive circuitry to reduce varactor noise contribution.

SUMMARY

An integrated circuit formed with a process that enables multiple types of gate stacks may include multiple first type transistors having a first gate stack with a first resistance. The integrated circuit also includes multiple second type transistors having a second gate stack with a second resistance that is higher than the first resistance. The integrated circuit further includes a metal oxide semiconductor varactor having the first gate stack with the first resistance.

A method of fabricating an integrated circuit (IC) with multiple types of gate stacks may include fabricating multiple first type transistors having a first gate stack with a first resistance. The method also includes fabricating multiple second type transistors having a second gate stack with a second resistance that is higher than the first resistance. The method further includes fabricating a metal oxide semiconductor varactor having the first gate stack with the first resistance.

An integrated circuit formed with a process that enables multiple types of gate stacks may include multiple first type transistors having a first gate stack with a first resistance. The integrated circuit also includes multiple second type transistors having a second gate stack with a second resistance that is higher than the first resistance. The integrated circuit further includes means for storing energy in an electrical field, in which the energy storing means includes the first gate stack with the first resistance.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 5A illustrates a physical model of a varactor in accordance with a complementary metal oxide semiconductor (CMOS) process of a dual gate process technology.

FIGS. 5B and 5C respectively illustrate a varactor circuit during accumulation and depletion.

DETAILED DESCRIPTION

Figure 1:
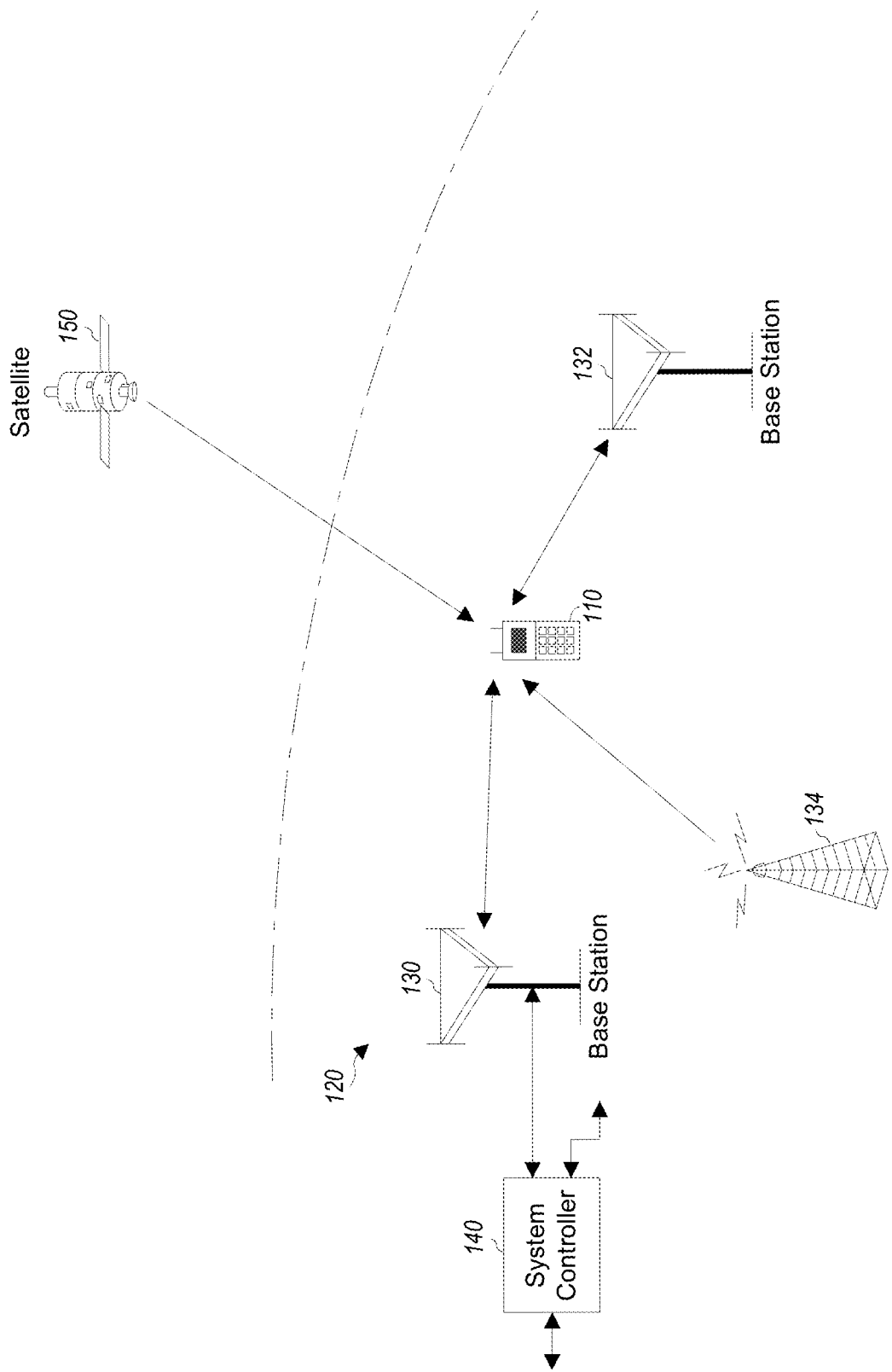
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit function to support communication enhancements. Further design challenges for mobile RF transceivers include analog/RF performance considerations, including mismatch, noise, and other performance considerations. The design of these mobile RF transceivers includes the use of a voltage controlled capacitance and/or a tunable capacitor (e.g., a varactor), for example, to provide a voltage controlled oscillator. Varactors may also be known as variable capacitance diodes.

A varactor is an example of an electrical device used to store energy (e.g., charge) in an electrical field between closely spaced capacitor plates according to a capacitance value. This capacitance value provides a measure of the amount of charge stored by the capacitor at a certain voltage. In addition to their charge storing capability, capacitors are also useful as electronic filters because they enable differentiation between high frequency and low frequency signals. In a conventional varactor, a plate width modulates to vary an electric field formed between the capacitor plates. Varactors provide an electrically controllable capacitance that can be used in tuned circuits. While the use of varactors is advantageous in many applications (e.g., due to small size and reduced cost), varactors generally exhibit a lower quality (Q)-factor and non-linearity because varactors are asymmetric devices.

Transceivers for various radio access technologies (e.g., 3G, 4G, and 5G) specify varactors (e.g., metal oxide semiconductor (MOS) varactors) with a high quality factor, especially at high frequencies (e.g., >1 GHz). These varactors may be used in voltage controlled oscillators (VCOs). One figure of merit (FoM) for VCOs is phase noise. An increased phase noise causes a decrease in signal-to-noise ratio (SNR), limits receiver sensitivity, and causes a degradation in error vector magnitude of a transmit chain.

One of the contributors to the phase noise of the VCO is the varactor used in a capacitor bank of an inductor-capacitor tank (LC tank) of the VCO. For example, the phase noise of the VCO increases with a decrease in a quality factor of the varactor. This increase in phase noise of the VCO is particularly noticeable at higher frequencies. The increase in phase noise results in degraded receiver sensitivity and reduced transmitter error vector magnitude. Accordingly, it is desirable to improve the phase noise of the VCO.

One way to improve the phase noise of the VCO is to improve the quality factor of the varactor. The varactor may be fabricated in accordance with a three-dimensional fin field effect transistor (finFET) process or any other process technology such as planar or metal oxide semiconductor technologies that implement multiple gate stacks with different resistances. In one aspect of the disclosure, the process technology may be a fourteen (14) nanometer finFET process. An integrated circuit (IC) (e.g., including a VCO) may be formed based on the process technology. The process technology may enable multiple (e.g., two) types of gate stacks instead of only one type of gate stack. For example, one or more first type transistors of the IC may have a first gate stack with a first resistance. Additionally, one or more second type transistors of the IC may have a second gate stack with a second resistance. The second resistance may be higher than the first resistance. The IC may also include a varactor (e.g., a MOS varactor) that has a gate stack with the first resistance. In one aspect of the disclosure, the IC is included in a transceiver circuit having a voltage controlled oscillator or any other phase locked loop based circuit.

In one aspect, the different types of transistors include an N-type or negative metal oxide semiconductor (NMOS) low voltage threshold field effect transistor (LVTN FET), a P-type or positive metal oxide semiconductor (PMOS) low voltage threshold field effect transistor (LVTP FET), an NMOS regular voltage threshold field effect transistor (RVTN FET), a PMOS regular voltage threshold field effect transistor (RVTP FET), and an NMOS high voltage threshold field effect transistor (HVTN FET). Conventionally, complex IC processes may be able to produce a great number of LVT devices and RVT devices. However, these complex IC processes may have limitations related to an absence of some types of threshold voltage devices.

A threshold voltage level of HVT devices is greater than the threshold voltage of RVT devices by about 80 mV. Super high threshold voltage (SHVT) devices show a delta in the threshold voltage level relative to RVT devices in the range of about 140-160 mV. These differences or delta in the threshold voltage between the different types of devices, HVT and RVT, SHVT and RVT, may be subjective and different technologies may have different deltas.

A process technology that implements multiple gate stacks with different resistances may be a fourteen nanometer (14 nm) finFET (e.g., 14 low power compact (LPC)-radio frequency (RF)) process technology. The 14 LPC-RF process technology is a metal (or conductive material) work function based process technology with dual gate stacks). The IC may be formed based on the 14 LPC-RF process technology. The process technology may enable multiple types of gate stacks instead of only one type of gate stack.

The multiple gate stack process technology (e.g., the 14 LPC-RF process technology) introduces other transistors with lower threshold voltages to the process technology. Such transistors include an NMOS analog low voltage threshold field effect transistor (ALVTN FET), a PMOS analog low voltage threshold field effect transistor (ALVTP), etc. For example, the first type of transistors of the 14 LPC-RF process technology may be the ALVTN FETs and the second type of transistors may be the RVTN FETs. In this example, the gate stack of the MOS varactor may correspond to the gate stack of the ALVTN FETs.

Differences exist between each gate stack of a dual gate stack (e.g., one for ALVT and one for RVT) that are associated with different process technologies. However, differences also exist between gate stacks of a common process technology (e.g., ALVTN and ALVTP or RVTN and RVTP). Thus, a dual gate stack may include more than two gate stacks. For example, a dual gate stack may include four gate stacks in a technology offering. For example, these dual gate stacks of different ALVTN and RVTN may be used for the MOS varactor and include n+gate/nwell type varactors for low input resistance Rg and Rsb. Rsb is a reverse bias diode resistance between a source and body. Other gate stacks such as the ALVTP/RVTP gate stacks are also present in the flow and are different from each other and the ALVTN/RVTN gate stacks.

The quality factor of the MOS varactor is dependent on the input resistance (Rg) of the MOS varactor, which corresponds to the resistance (e.g., the first resistance or the second resistance) of the gate stack of the first type of transistors or the second type of transistors. The input resistance may be an input resistance under high frequency conditions or under direct current (DC) conditions. Higher input resistance of the MOS varactor corresponds to a higher quality factor and vice versa. Aspects of the present disclosure use a gate stack for the MOS varactor that corresponds to the lowest input resistance. For example, the MOS varactor uses the lowest resistance gate metal, which in this case is the ALVTN FET's gate stack that is available with the current processing technology. The MOS varactor may be a thin gate oxide varactor or a thick gate oxide varactor.

Aspects of the present disclosure improve the quality factor of MOS varactors at the device level, thus improving radio frequency (RF)/analog product performance metrics such as phase noise, receiver sensitivity, and transmitter error vector magnitude.

Figure 8:
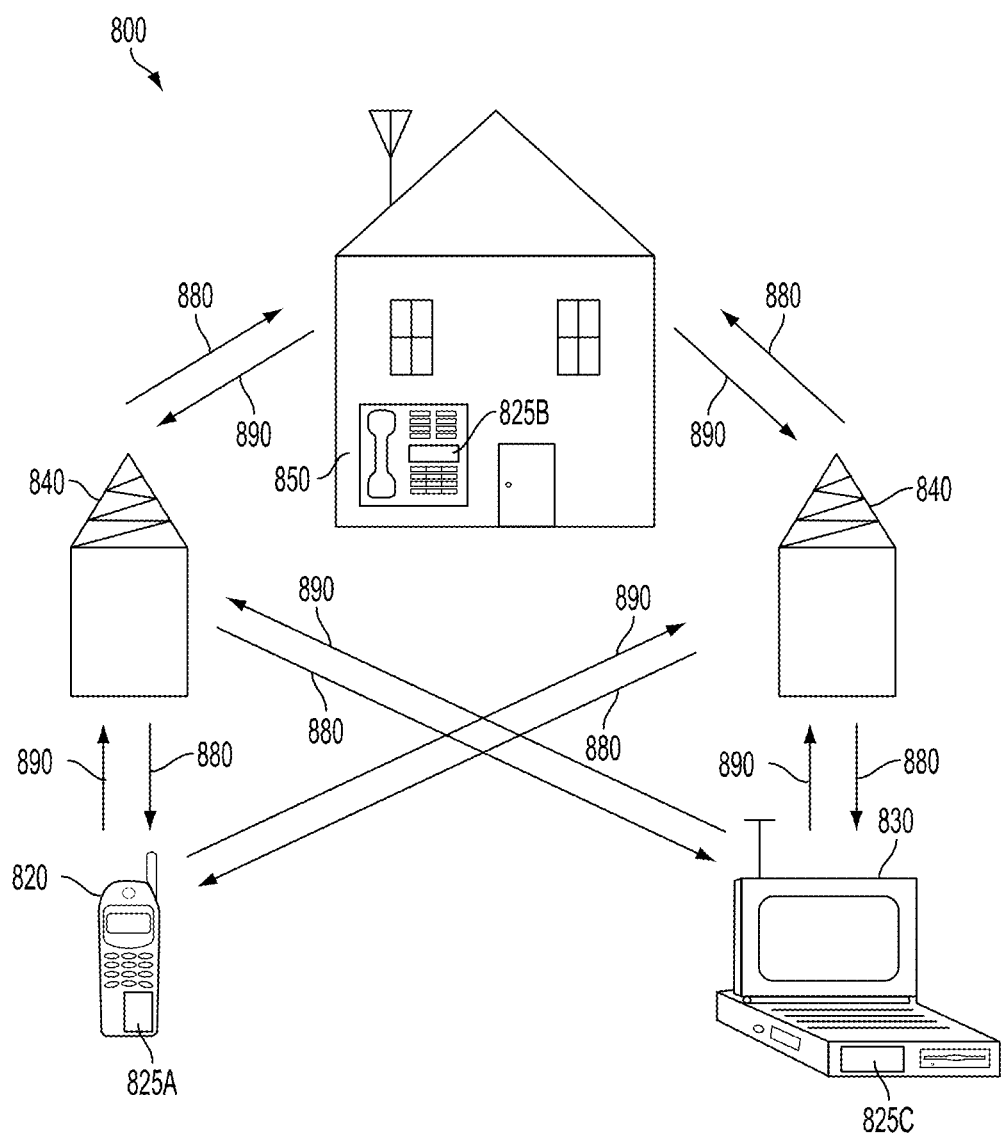
FIG. 8 is a block diagram showing an exemplary wireless communication system in which a configuration of the disclosure may be advantageously employed.

The aspects of the present disclosure may be implemented in the system of FIGS. 1 and 8. More specifically, aspects of the present disclosure may be implemented in the wireless devices of FIGS. 2 and 6.

FIG. 1 shows a wireless device 110 communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

Figure 2:
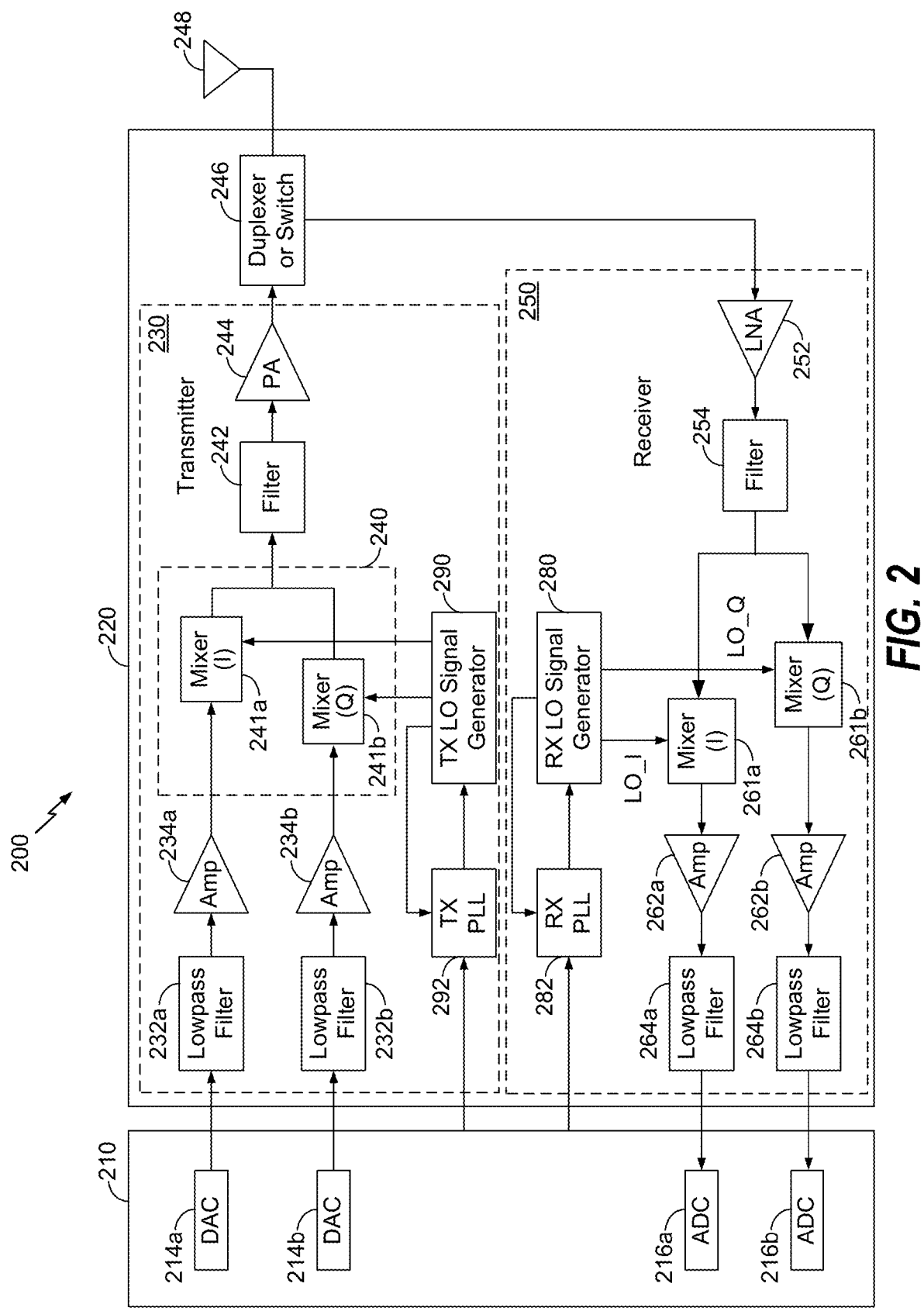
FIG. 2 shows a block diagram of the wireless device in FIG. 1, according to an aspect of the present disclosure.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to reduce undesired images caused by the prior digital-to-analog conversion. Amplifiers (Amp) 234a and 234b amplify the signals from lowpass filters 232a and 232b, respectively, and provide in-phase (I) and quadrature (Q) baseband signals. An upconverter 240 including upconversion mixers 241a and 241b upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

Figure 3:
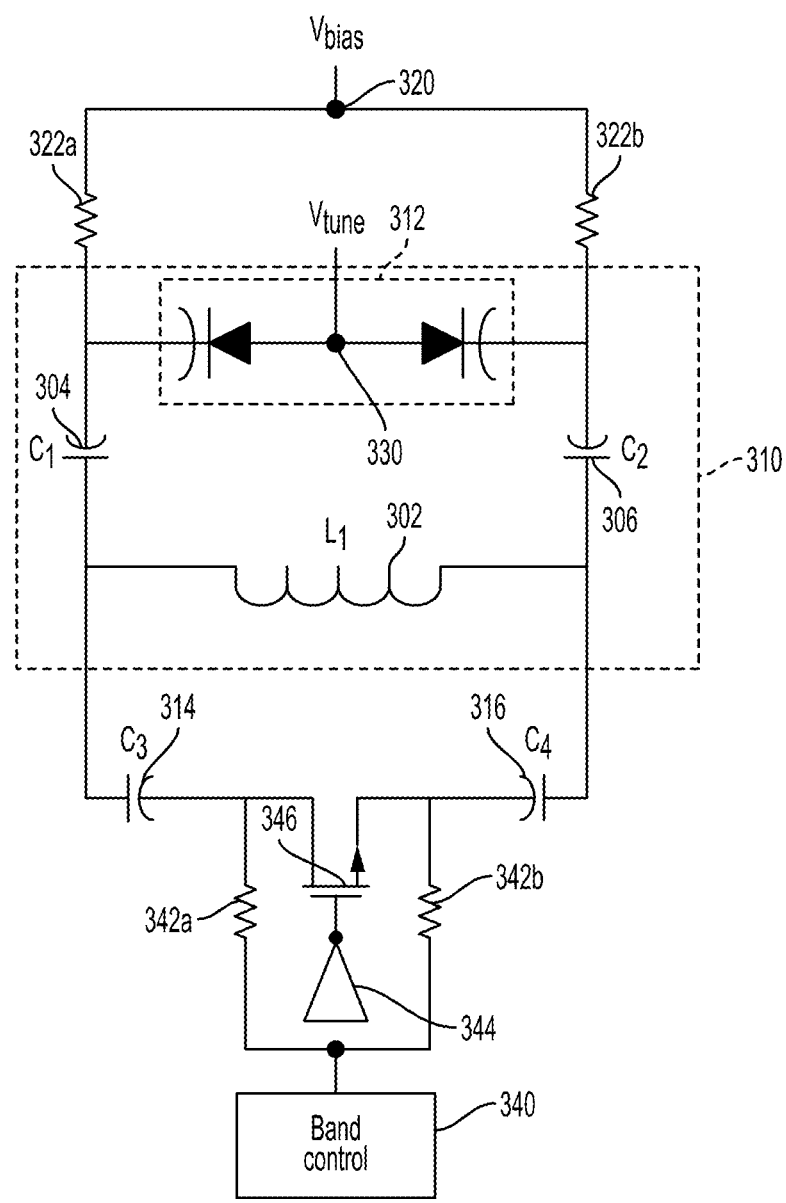
FIG. 3 shows an exemplary circuit diagram of an oscillator circuit.

FIG. 3 is a circuit diagram of an oscillator circuit. An oscillator circuit (oscillator) 300 is shown. The oscillator 300 may have an inductor $L_1$ 302 electrically coupled to a pair of coupling capacitors C1 304 and C2 306. In some aspects, the coupling capacitors C1 304 and C2 306 electrically couple the inductor L1 302 to a varactor circuit, shown as a pair of varactors 312. The varactors 312 may operate as voltage controlled capacitors. The inductor L1 302 may further be electrically coupled to a pair of coarse tuning capacitors: a coarse tuning capacitor C3 314 and a coarse tuning capacitor C4 316 (referred to as "coarse capacitors"). The combination of L1 302, C1 304, C2 306, and the varactors 312 may also be referred to as a "tank circuit," "tank" or "LC circuit" 310 (indicated in dashed lines). In some aspects, the tank 310 can act as an electrical resonator, storing energy oscillating at a characteristic resonant frequency of the circuit.

In some aspects, the tank 310 may not have all of the components identified in FIG. 3 and described, depending on the configuration of the oscillator 300. The tank 310 may have only a single capacitor and a single inductor. In some aspects, the tank 310 can include L1 302 in combination with C1 304, C2 106, C3 314 and C4 316. In another aspect, the tank 310 can be considered to include L1 302 in combination with C1 304, C2 306, C3 314, C4 316, and the varactors 312. In yet another aspect, the tank 310 may have additional inductive, capacitive, and resistive circuitry implemented to change or regulate the resonant frequency of the tank 310.

The oscillator 300 can further have an input voltage bias (Vbias) 320. An input may generally refer to an electrical coupling that can receive a voltage input, for example. The Vbias 320 may be or receive a variable or constant direct current (DC) voltage applied to C1 304 and C2 306 of the tank 310. The oscillator 300 may further have an input voltage (Vtune) 330. The Vtune 330 may also be or receive a variable or constant DC voltage applied to the varactors 312 to tune or adjust the frequency of the oscillator 300. The capacitance of the varactors 312 can further be a function of the difference between the Vbias 320 and the Vtune 330. Additionally, as the capacitance of the varactors 312 is changed, the frequency of the oscillator 300 also changes.

In an aspect, the input Vbias 320 and the input Vtune 330 in combination with the tank 310 and the varactors 312 can be combined as the oscillator 300 configured as a VCO.

In some aspects, the oscillator 300 may further comprise a band control input 340 ("band control 340") electrically coupled to the coarse capacitors 314 and 316. The coarse capacitors C3 314 and C4 316 may form a portion of a switchable capacitor array for use in the oscillator 300 (e.g., a VCO or a DCO). The coarse capacitors C3 314 and C4 316, in conjunction with a metal oxide semiconductor (MOS) device 346 (referred to as "switch 146") and an inverter 144 can comprise such a switchable array. The switch 146 can be an n-type MOS (NMOS) or a p-type MOS (PMOS) transistor, having a drain coupled to the coarse capacitor C3 114, a source coupled to the other coarse capacitors C4 316, and a gate coupled to a control signal, shown as the band control 340. The band control 340 can be coupled to the switch 346 via an inverter 344. In some aspects, the inverter 344 may not be present.

The band control 340 can provide a digital control signal for a DCO to generate a clock signal, for example. Thus, the bottom portion of the oscillator 300 of FIG. 3, taken by itself, may comprise a DCO. The band control 340 may supply the digital signal to the inverter 344 and the switch 346 to induce a voltage to the tank 310. The inverter 344 and the switch 346 may not be specified for certain VCO implementations.

In some aspects, a number of resistors may be included in the oscillator 300 to minimize or reduce the phase noise contributed by the varactors 312. For example, resistors 322a, 322b (collectively resistors 322) may be incorporated in the oscillator 300 in shunt between the Vbias 320 and the tank 310. The value of the resistors 322 can be selected to be high enough to reduce the noise contribution of the varactors 312 but low enough so as to not increase the thermal noise contribution of the tank circuit (that would negatively affect the quality (Q)-factor of the tank 310). Accordingly, the resistor value may be in the kilo ohm (kΩ) range (e.g., 1 K ohm-1000 K ohm). However, in such an aspect, the resistors 322 themselves can contribute varying levels of thermal noise, resulting in phase noise and jitter induced in the output of the oscillator 300.

In a similar fashion, resistors 342a, 342b (collectively resistors 342) may also be incorporated in the oscillator 300 to bias the switch 346. Using the threshold voltage ($V_{th}$) of the switch 346, the value of the resistors 342 can be selected to turn the switch 346 on and off based on the signal supplied by the band control 340. The switch 346 can thus be used to reliably switch the coarse capacitors $C_3$ 314 and $C_4$ 316 on or off from (or in and out of) the LC tank 310 so that the oscillator 300 can precisely generate a specified high frequency signal according to the band control 340 signal. In some aspects, the band control 340 is a digital signal that alternatively switches the coarse capacitors $C_3$ 314 and $C_4$ 316 in and out of the oscillator 300 circuit to create the output signal (e.g., a clock signal).

In some aspects, the thermal noise added by the resistors 322, 342 may be a result of thermal flux inside the individual resistors 322 and 342. The thermal flux may add a noise component to the VCO frequency and ultimately manifest as phase noise (in a VCO, for example) or jitter (in a DCO, for example). The phase noise/jitter degrades the spectral purity of the oscillator 300 and may negatively affect the Q-factor.

Metal oxide semiconductor field effect transistors (MOSFETs or FETs) represent one important type of circuit element that substantially determines performance of integrated circuits (ICs). A difference between the NMOS and PMOS transistors is based on the type of dopants used to create the source/drain regions of the devices. Complementary metal oxide semiconductor (CMOS) technology or products refers to IC products that are manufactured using both NMOS and PMOS transistor devices.

Current flow through the FET is controlled by controlling the voltage applied to a gate electrode. In manufacturing modern IC products, transistor devices are sometimes intentionally formed so as to exhibit different threshold voltage levels. In general, a transistor having a relatively lower threshold voltage will operate at a higher switching speed than that of a corresponding transistor with a relatively higher threshold voltage level.

Conventional process technology that enables multiple (e.g., two) types of gate stacks has limited availability of process technologies for the gate stacks. For example, conventional dual stack process technology does not include an analog low threshold voltage (ALVT) gate stack. A fourteen (14) nanometer process technology (e.g., 14 low power plus (LPP) process technology, which is a digital based process technology with a single gate stack), includes halo based RVT, LVT, HVT, and SHVT devices. Halo implantation processes are conventionally performed for adjusting the threshold voltage when fabricating modern semiconductor devices, such as MOS transistors, with short channels (e.g., less than 50 nm channel length). The result is a complex process flow, even posing the risk of introducing unacceptably high variations of the threshold voltage across the wafer due to the inclusion of new processes. Moreover, the halo implanting process has a drawback of introducing additional masks to the process flow, thereby increasing cost.

Some process technologies may implement multiple gate stacks with different resistances. The 14 LPC-RF process technology is a metal work function based process technology with dual gate stacks. A significant number of halo/low doped drain masks are eliminated from the 14 LPC-RF process technology relative to other process technologies (e.g., the 14 LPP process technology) to achieve cost reduction. Moreover, the 14 LPC-RF process technology includes an additional gate stack to enable ALVTN and ALVTP. The metal work function of each gate stack of the 14 LPC-RF process technology is set to anchor at a specific threshold voltage for ALVTN, ALVTP, RVTN, and RVTP.

Table 1 illustrates different gate stacks of the 14 LPC-RF process technology as well as example composition and size values of the different gate stacks. An IC may be formed based on the process technology. The process technology may enable multiple (e.g., two) types of gate stacks instead of only one type of gate stack. For example, one or more first type transistors of the IC may have a first gate stack (e.g., ALVTN/P) with a first resistance. Additionally, one or more second type transistors of the IC may have a second gate stack (e.g., RVTN/P) with a second resistance that is higher than the first resistance.

Note that the composition and size values illustrated in Table 1 are exemplary and can be different based on different process conditions. For example, differences exist between each gate stack of a dual gate stack (e.g., one for ALVT and one for RVT) that are associated with different process technologies. However, differences also exist between gate stacks of a common process technology (e.g., ALVTN and ALVTP or RVTN and RVTP). The ALVTN gate stack, which is an N-type metal oxide semiconductor (NMOS) gate stack, is different from the ALVTP gate stack, which is a P-type metal oxide semiconductor (PMOS) gate stack.

Thus, a dual gate stack may include more than two gate stacks. For example, a dual gate stack may include four gate stacks in a technology offering. These dual gate stacks may be used for the mobile RF chip designs. Other gate stacks, such as the ALVTP/RVTP gate stacks, are also present in the flow and are different from each other and the ALVTN/RVTN gate stacks.

Table 1 includes a first column that represents different compositions of each gate stack of the 14 LPC-RF process technology. The remaining columns (2-5) represent each of the different gate stacks (RVTN, ALVTN, ALVTP, and RVTP) and their corresponding size values. In one aspect, the gate stacks of the 14 LPC-RF process technology may be high-K metal gates. In some aspects, each gate stack may be composed of a several different high-K materials (e.g., materials having a dielectric constant or K value greater than 10) depending on the device specification. For example, each gate stack may include a high-k dielectric material, which may include hafnium oxide (HfO2), hafnium zirconium oxide (HfZrO2), hafnium aluminum oxide (HfAl2O3), etc. In some aspects, the size value (e.g., 20-40 angstrom (A)) for the high-k dielectric material may be common to all of the gate stacks.

The gate stacks may also include an interfacial oxide between a silicon layer (e.g., silicon substrate) and the high-k dielectric material. This layer of interfacial oxide is usually very thin and may not be shown independent of the high-k dielectric material. In some aspects, a size value (e.g., 5-10 A) for the interfacial oxide may be common to all of the gate stacks. The gate stack may also include a barrier layer that may include a first barrier layer and a second barrier layer where each of the first and second barrier layers are composed of a different material. For example, the first barrier layer may be composed of titanium nitride (TiN) or tantalum nitride (TaN). In some aspects, a size value (e.g., 20-40 A) for the first barrier layer may be common to all of the gate stacks. The second barrier layer may be composed of titanium carbide (TiC) or titanium-aluminum-carbide (TiAlC). In some aspects, a size value (e.g., 40-70 A) for the second barrier layer may be common to all of the gate stacks.

The metal work function of the gate stack may be composed of TiN, titanium-aluminum-nitride (TiALN), or TaN. A size value (e.g., 40-70 A) for each metal work function of the different gate stacks, however, is different. For example, a thickness (5-20 A) of the metal work function of the ALVTN gate stack is less than a thickness (20-40 A) of the metal work function of the RVTN gate stack. A thickness (70-100 A) of the metal work function of the ALVTP gate stack, however, is greater than a thickness (50-80 A) of the metal work function of the RVTP gate stack. The gates or gate electrode have Tungsten as the main conductor although the thickness of Tungsten may be different.

For example, a thickness (160-220 A) of the gate electrode of the ALVTN gate stack is greater than a thickness (145-200 A) of the gate electrode of the RVTN gate stack. A thickness (95-140 A) of the gate electrode of the RVT gate stack, however, is less than a thickness (115-160 A) of the gate electrode of the ALVTP gate stack. An overall size of each of the gate stacks may be within a similar range of 250 to 400 A.

TABLE 1

| Numbers in Angstroms and composition of the stack | Current gate stack (RVTN) | Proposed gate stack (lower metal work function thickness) ALVTN | RVTP | ALVTP |
|---|---|---|---|---|
| W | 145-200 A | 160-220 A | 95-140 A | 115-160 A |
| TiN or TaN | 20-40 A | 20-40 A | 20-40 A | 20-40 A |
| TiC or TiAlC | 40-70 A | 40-70 A | 40-70 A | 40-70 A |
| Metal work function (TiN, TiAlN, or TaN) | 20-40 A | 5-20 A | 70-100 A | 50-80 A |
| High-k dielectric (HfO2, HfZrOx, HfAlOx, etc.) | 20-40 A | 20-40 A | 20-40 A | 20-40 A |
| Interfacial oxide between silicon and high-k (HfO2 or HfZrOx or HfAlOx). Usually too thin. | 5-10 A | 5-10 A | 5-10 A | 5-10 A |
| Total | 250-400 A | 250-400 A | 250-400 A | 250-400 A |

Figure 4:
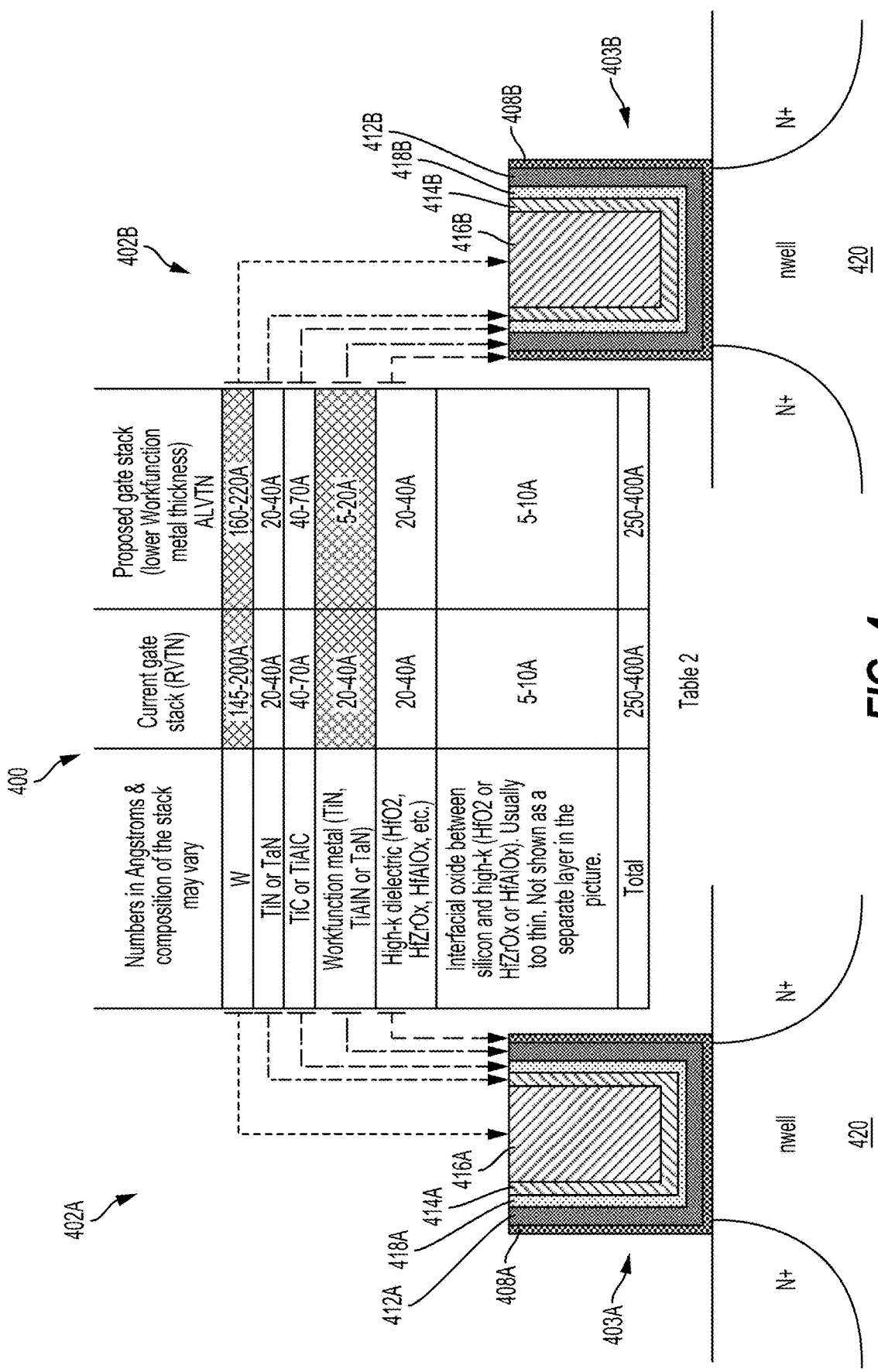
FIG. 4 is an exemplary illustration of a dual gate stack of a dual gate process technology juxtaposed against a table illustrating example composition and size values of different gate stacks.

FIG. 4 is an exemplary illustration 400 of a dual gate stack 403 of a dual gate process technology (e.g., 14 LPC-RF process technology) juxtaposed against a table (e.g., Table 2) illustrating example composition and size values of the different gate stacks. Table 2 is similar to Table 1 with the only difference being that that Table 2 does not include the RVTP and the ALVTP gate stacks and their corresponding composition and size values. For example, Table 2 includes the composition and size values of a RVTN gate stack 403A of a first transistor 402A and an ALVTN gate stack 403B of a second transistor 402B. The first and the second transistors 402A and 402B may be fabricated on a semiconductor substrate 420. The semiconductor substrate 420 may be composed of silicon, silicon germanium, gallium arsenic, or other suitable semiconductor material. The substrate 420 has other features including doped regions such as a P-type well or an N-type well.

The RVTN gate stack 403A includes a dielectric material (e.g., a high-k dielectric material) 408A, a metal work function 412A, a first barrier layer 414A, a second barrier layer 418A, and a gate electrode metal 416A. The ALVTN gate stack 403B includes a dielectric material (e.g., a high-k dielectric material) 408B, a metal work function 412B, a third barrier layer 414B, a fourth barrier layer 418B, and a gate electrode metal 416B. The devices and features of each of the RVTN gate stack 403A and the ALVTN gate stack 403B are similar to those described with respect to Table 1.

The RVT (N/P) gate stack may have a threshold voltage of approximately 220-260 millivolts (mV) for a 0.8 V supply voltage process. A further reduction in the threshold voltage of a gate stack is achieved with the 14 LPC-RF process technology, which enables additional gate stacks with lower saturated threshold voltages. For example, the 14 LPC-RF process technology enables a second gate stack to form the ALVTN/P transistor with a threshold voltage (Vt) of approximately seventy millivolts (~70-90 mV) for a gate length of fourteen nanometers (14 nm).

Aspects of the present disclosure leverage multiple (e.g., two) types of gate stacks of an existing process technology (e.g., 14 LPC-RF process technology) to form a metal oxide semiconductor varactor having a first gate stack (e.g., ALVTN gate stack 403B) with the first resistance that is lower than a second resistance of a second gate stack (e.g., RVTN gate stack 403A) of the dual gate process technology.

FIG. 5A illustrates a physical model of a varactor 500A in accordance with a CMOS process of a dual gate process technology, such as the 14 LPC-RF process technology. The varactor 500A may be fabricated on a semiconductor substrate 520. For example, the varactor 500A may be one of the transistors of the 14 LPC-RF process technology. The varactor 500A may have a gate stack with the lower resistance. The semiconductor substrate 520 includes other features such as various doped regions such as a P-type well or an N-type well (e.g., n-well). The varactor 500A includes a source region 505, a drain region 507 and a gate region 503.

FIGS. 5B and 5C respectively illustrate a varactor circuit 500B during accumulation and a varactor circuit 500C during depletion. The varactor circuits 500B, 500C include various resistances, various capacitances, and an inductance ($L_s$). The various resistances include a gate resistance ($R_g$), a well resistance ($R_w$), a low doped drain and contact resistance ($R_d$), and an accumulation layer resistance ($R_{acc}$). The various capacitances include an oxide capacitance ($C_{ox}$), a channel to source/drain depletion capacitance ($C_d$), a semiconductor capacitance ($C_{si}$), and a well capacitance ($C_w$).

Figure 5D:
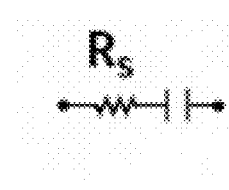
FIG. 5D illustrates varactor loss associated with an increased series resistance ($R_s$) during accumulation and depletion.

During accumulation, $C_{si}$ is associated with an accumulation layer charge. During depletion, $C_{si}$ is a depletion capacitance associated with fixed donor charge. The following equations illustrate varactor loss associated with an increased series resistance ($R_s$) during accumulation and depletion as shown in FIG. 5D. The series resistance can be reduced by controlling the device geometry. The series resistance also varies with bias voltage because $R_{acc}$, $C_s$, and $C_d$ are bias dependent.

Series Resistance (Varactor Loss)

Accumulation $$R_s \cong \left( R_g + \left[ \frac{1}{2}(R_{acc} + R_d) \| R_w \right] \right)$$

Depletion $$R_s \cong R_g + R_w \left( \frac{C_{si}}{C_{si} + 2C_d} \right)^2$$

A quality factor of the varactor may be defined by the following equation:

Quality Factor (Q)

$$Q = \frac{1}{\omega R_s C_s}$$

where ω is an angular frequency.

Figure 5E:
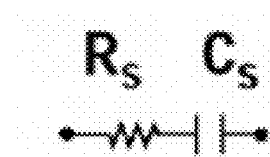
FIG. 5E illustrates a quality factor of a varactor.

The quality factor of the varactor is frequency dependent. The quality factor of the varactor is also bias dependent because the series resistance ($R_s$) and a series capacitance ($C_s$) vary with bias, as shown in FIG. 5E.

Figure 6:
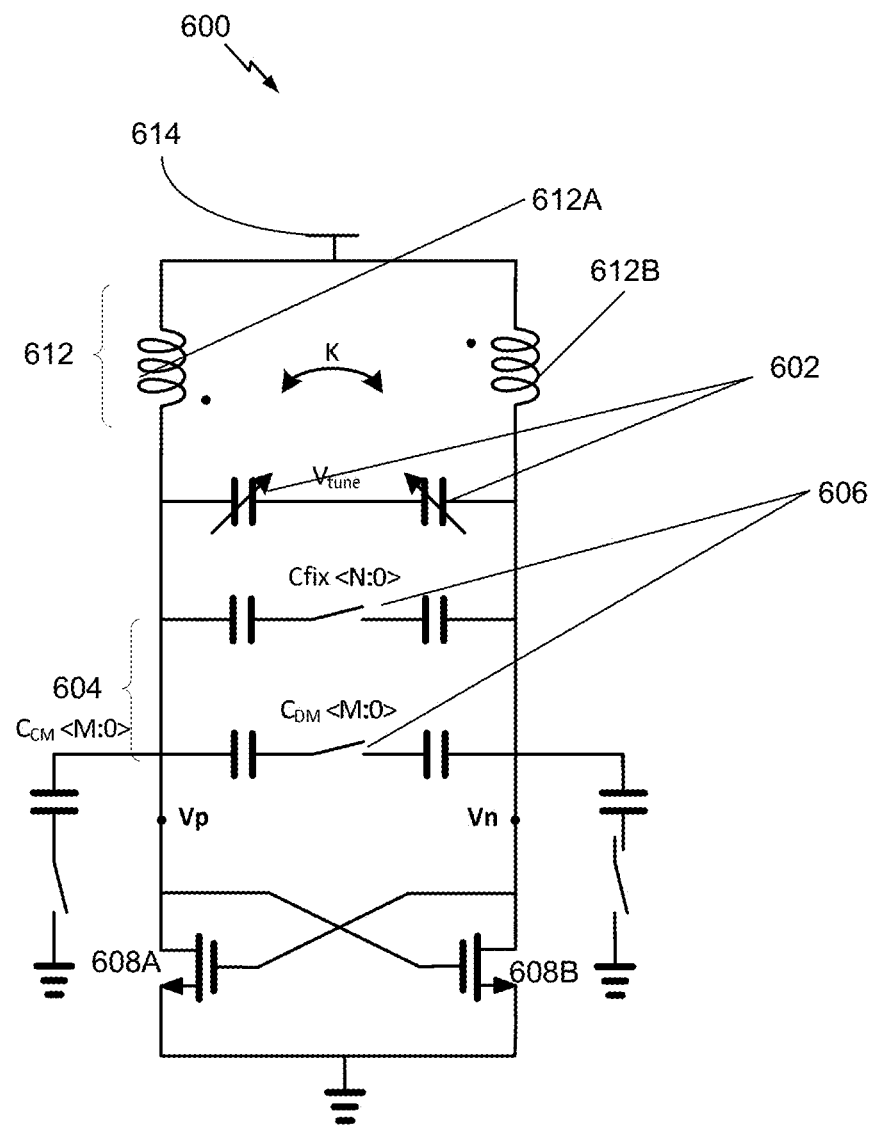
FIG. 6 illustrates an exemplary core of a voltage controlled oscillator (VCO) including metal oxide semiconductor (MOS) varactors, according to aspects of the present disclosure.

FIG. 6 illustrates an exemplary core 600 of a voltage controlled oscillator (VCO) including MOS varactors, according to aspects of the present disclosure. The VCO core 600 includes an inductor-capacitor (LC) tank (e.g., VCO capacitor tuning circuit) that includes a digitally controlled differential metal-metal capacitor $C_{DM}$, digitally controlled single ended metal-metal capacitor $C_{CM}$, and a fixed adjustment capacitor Cfix, which can be digitally controlled or not. The inductor-capacitor tank may also include an analog controlled varactor 602 (e.g., the MOS varactor described herein) represented by the capacitor symbol with an arrow through the capacitor and controlled by voltage vtune. The VCO core 600 further includes inductor 612 (e.g., differential inductors 612A and 612B). A supply voltage Vdd is provided to a center tap node 614 of the VCO core 600.

Selection of capacitors $C_{DM}$ or Cfix in a capacitor bank 604 is controlled by on/off control of switches 606 between the capacitors $C_{DM}$ and/or Cfix to vary the capacitance of the VCO. In some aspects, the varactor 602 and/or the capacitor $C_{CM}$ may be part of or collectively referred to as the capacitor bank 604 of the VCO. A cross coupled pair of transistors 608A and 608B are part of transistors of the VCO core 600. Vp and Vn are differential outputs from the inductor-capacitor tank.

Figure 7:
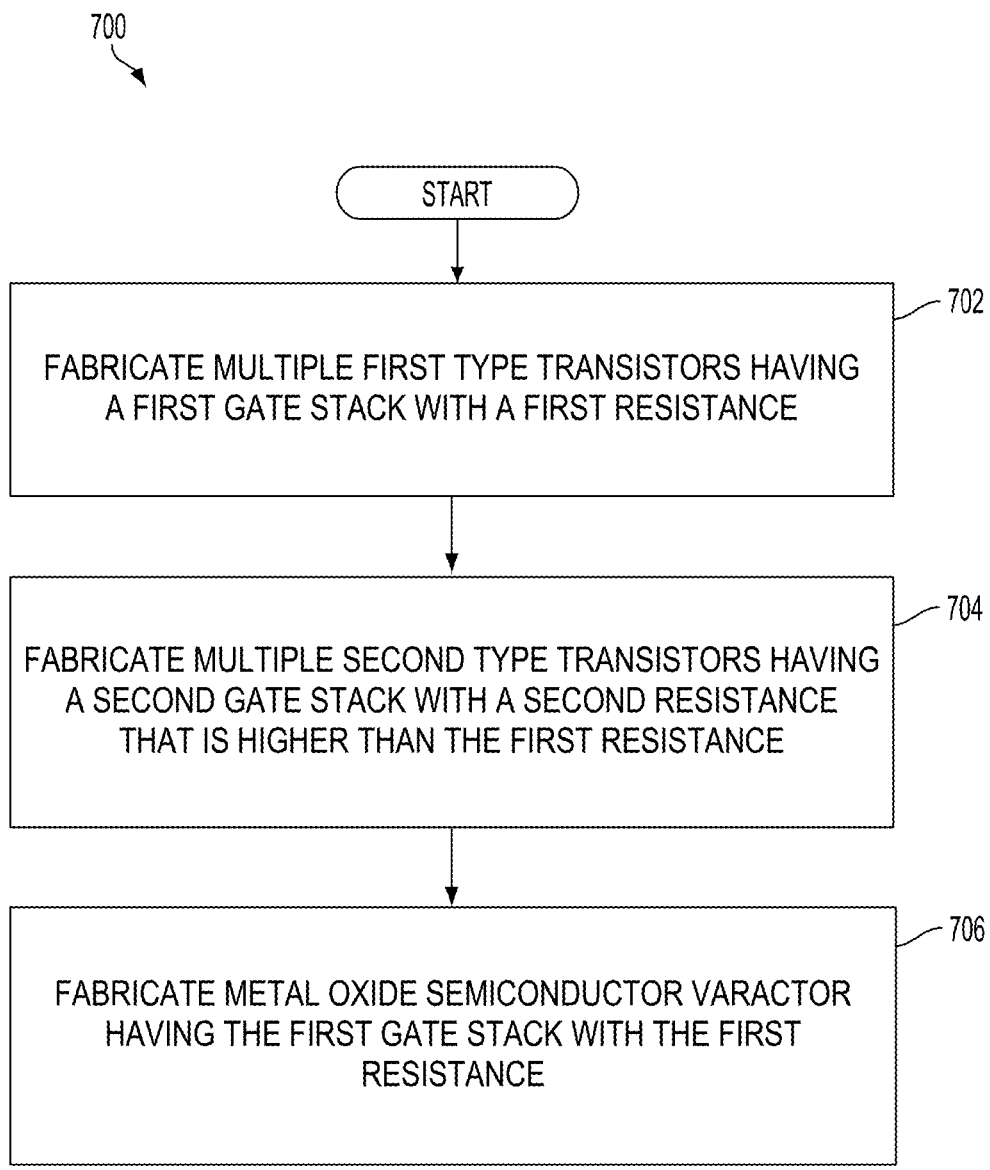
FIG. 7 depicts a simplified flowchart of a method of fabricating a metal oxide semiconductor varactor according to aspects of the present disclosure.

FIG. 7 depicts a simplified flowchart of a method 700 of fabricating an integrated circuit that enables multiple types of gate stacks. At block 702, multiple first type transistors having a first gate stack with a first resistance are fabricated. At block 704, multiple second type transistors having a second gate stack with a second resistance that is higher than the first resistance are fabricated. At block 706, a metal oxide semiconductor varactor having the first gate stack with the first resistance is fabricated.

According to one aspect of the present disclosure, an integrated circuit is described. The integrated circuit includes means for storing energy in an electrical field. The energy storing means may, for example, be the pair of varactors 312, the varactor 500A, the varactor circuit 500B, the varactor circuit 500C and/or the varactor 602. In another aspect, the aforementioned means may be any module or any apparatus or material configured to perform the functions recited by the aforementioned means.

FIG. 8 is a block diagram showing an exemplary wireless communication system in which a configuration of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825B, and 825C that include the disclosed MOS varactor. It will be recognized that other devices may also include the disclosed MOS varactor, such as the base stations, switching devices, and network equipment. FIG. 8 shows forward link signals 880 from the base station 840 to the remote units 820, 830, and 850 and reverse link signals 890 from the remote units 820, 830, and 850 to base station 840.

In FIG. 8, remote unit 820 is shown as a mobile telephone, remote unit 830 is shown as a portable computer, and remote unit 850 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the MOS varactor.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit formed with a process that enables multiple types of gate stacks, the integrated circuit comprising:
    a plurality of first type transistors having a first gate stack with a first resistance;
    a plurality of second type transistors having a second gate stack with a second resistance that is higher than the first resistance; and
    a metal oxide semiconductor varactor having a third gate stack having a gate conductive material with a substantially same resistance as the first resistance.

2. The integrated circuit of claim 1, in which the plurality of first type transistors having the first gate stack include N-type analog low voltage threshold field effect transistors (ALVTN FETs), or P-type analog low voltage threshold field effect transistors (ALVTP FETs).

3. The integrated circuit of claim 1, in which the plurality of second type transistors having the second gate stack include an N-type regular voltage threshold field effect transistors (RVTN FETs), or a P-type regular voltage threshold field effect transistors (RVTP FETs).

4. The integrated circuit of claim 1, included within a voltage controlled oscillator.

5. The integrated circuit of claim 4, included in a transceiver circuit.

6. The integrated circuit of claim 1, included in a phase locked loop based circuit.

7. A method of fabricating an integrated circuit (IC) with multiple types of gate stacks comprising:
    fabricating a plurality of first type transistors having a first gate stack with a first resistance;
    fabricating a plurality of second type transistors having a second gate stack with a second resistance that is higher than the first resistance; and
    fabricating a metal oxide semiconductor varactor having a third gate stack having a gate conductive material with a substantially same resistance as the first resistance.

8. The method of claim 7, in which fabricating the plurality of first type transistors having the first gate stack include fabricating N-type analog low voltage threshold field effect transistors (ALVTN FETs), or P-type analog low voltage threshold field effect transistors (ALVTP FETs).

9. The method of claim 7, in which fabricating the plurality of second type transistors having the second gate stack include fabricating N-type regular voltage threshold field effect transistors (RVTN FETs), or P-type regular voltage threshold field effect transistors (RVTP FETs).

10. The method of claim 7, further comprising integrating the IC within a voltage controlled oscillator.

11. The method of claim 10, further comprising integrating the IC within a transceiver circuit.

12. The method of claim 7, further comprising integrating the IC within a phase locked loop based circuit.

13. An integrated circuit formed with a process that enables multiple types of gate stacks, the integrated circuit comprising:
    a plurality of first type transistors having a first gate stack with a first resistance;
    a plurality of second type transistors having a second gate stack with a second resistance that is higher than the first resistance; and
    means for storing energy in an electrical field, the energy storing means comprising a third specified gate stack having a gate conductive material with a substantially same resistance as the first resistance.

14. The integrated circuit of claim 13, in which the plurality of first type transistors having the first gate stack include an N-type analog low voltage threshold field effect transistors (ALVTN FETs), or a P-type analog low voltage threshold field effect transistors (ALVTP FETs).

15. The integrated circuit of claim 13, in which the plurality of second type transistors having the second gate stack include an N-type regular voltage threshold field effect transistors (RVTN FETs), or a P-type regular voltage threshold field effect transistors (RVTP FETs).

16. The integrated circuit of claim 13, included within a voltage controlled oscillator.

17. The integrated circuit of claim 16, included in a transceiver circuit.

18. The integrated circuit of claim 13, included in a phase locked loop based circuit.

* * * * *